(12) United States Patent
Oshima

(10) Patent No.: US 6,828,634 B2
(45) Date of Patent: Dec. 7, 2004

(54) SEMICONDUCTOR DEVICE WITH TWO TYPES OF FET'S HAVING DIFFERENT GATE LENGTHS AND ITS MANUFACTURE METHOD

(75) Inventor: Tadashi Oshima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/996,758

(22) Filed: Nov. 30, 2001

(65) Prior Publication Data

US 2002/0102782 A1 Aug. 1, 2002

(30) Foreign Application Priority Data

Jan. 29, 2001 (JP) ........................................ 2001-020261

(51) Int. Cl.⁷ ..................... H01L 29/76; H01L 29/94; H01L 31/062; H01L 31/113; H01L 31/119
(52) U.S. Cl. .................. 257/369; 257/391; 257/900
(58) Field of Search ................................. 438/199, 217, 438/230, 276, 283, 289, 303, 595, 664, 902; 257/202, 204, 206, 274, 338, 344, 350, 351, 357, 368, 369, 391, 392, 900

(56) References Cited

U.S. PATENT DOCUMENTS 5,637,525 A * 6/1997 Dennison ................ 438/232
5,686,331 A * 11/1997 Song ....................... 438/303
6,281,558 B1 * 8/2001 Sayama et al. ............ 257/391
6,413,810 B1 * 7/2002 Matsuhashi ................ 438/231
6,417,055 B2 * 7/2002 Jang et al. ................. 438/303

FOREIGN PATENT DOCUMENTS

| JP | 5-326503 | 12/1993 |
|---|---|---|
| JP | 6-224161 | 8/1994 |
| JP | 7-22396 | 1/1995 |
| JP | 9-237777 | 9/1997 |
| JP | 9-251988 | 9/1997 |
| JP | 2705187 | 10/1997 |

* cited by examiner

*Primary Examiner*—Hoai Pham
(74) *Attorney, Agent, or Firm*—Westerman, Hattori, Daniels & Adrian, LLP

(57) ABSTRACT

A gate electrode conductive film is formed on the surface of a semiconductor substrate. First and second gate mask patterns made of a first insulating material are formed on the gate electrode conductive film on first and second sections. Sidewall spacers are formed on the sidewalls of the first and second gate mask patterns, the sidewall spacer being made of a second insulating material having an etching resistance different from the first insulating material. The second section is covered with a mask pattern and the sidewall spacer on the sidewall of the first gate mask pattern is removed. The gate electrode conductive film is etched to leave first and second gate electrodes on the first and second sections.

5 Claims, 9 Drawing Sheets

SEMICONDUCTOR DEVICE WITH TWO TYPES OF FET'S HAVING DIFFERENT GATE LENGTHS AND ITS MANUFACTURE METHOD

This application is based on Japanese Patent Application 2001-020261, filed on Jan. 29, 2001, the entire contents of which are incorporated herein by reference.

BACKGROUND OF THE INVENTION

A) Field of the Invention

The present invention relates to a semiconductor device and its manufacture method, and more particularly to a semiconductor device suitable for forming two types of field effect transistors (FET) having different gate lengths.

B) Description of the Related Art

To meet the requirements for high speed operations of a semiconductor integrated circuit, techniques of narrowing an electrode width or a patterning width of photolithography over a process limit are desired. In a ultra high speed semiconductor device (such as a general logic circuit device and a logic circuit mixed with DRAM) having a static random access memory (SRAM) circuit and a logic circuit, if the logic circuit only is to be speeded up, it is necessary to shorten the gate length of FET's of the logic circuit. To this end, a reticle is required to be revised by a new edition.

For a stepper using KrF excimer laser at a wavelength of 248 nm, it is difficult to form resist patterns having a line width of 0.2 $\mu$m at a standard deviation of 0.01 $\mu$m or smaller.

Techniques of reducing a patterning line width over a process limit of photolithography are disclosed in JP-A-7-22396, JP-A-9-237777 and JP-9-251988. According to the techniques disclosed in JP-7-22396, an etching mask pattern itself is side-etched to narrow a line width of the mask pattern. According to the techniques disclosed in JP-A-9-237777 and JP-A-9-251988, a resist pattern is made narrower by isotropically etching the resist pattern.

FIG. 7A is a plan view showing an FET on a logic circuit section. A ate electrode 202 crosses an active region 200. The gate electrode 202 is patterned by using a resist pattern obtained by narrowing a resist pattern 201 made through the exposure and development. Since the gate length (width in the vertical direction in FIG. 7A) of the gate electrode 202 can be shortened, FET can be speeded up.

FIG. 7B is a plan view of FET's on an SRAM section. Two active regions 210 and 211 are disposed in parallel to each other. Gate electrodes 213 and 215 cross the active region 210, and gate electrodes 217 and 219 cross the active region 211. The gate electrode 217 is disposed on a straight line extended from the gate electrode 213, and one end of the gate electrode 217 faces one end of the gate electrode 213. The relative positional relation between the gate electrodes 215 and 219 is the same as that between the gate electrodes 213 and 217.

The gate electrodes 213, 215, 217 and 219 are patterned by using a resist mask pattern obtained by narrowing resist patterns 212, 214, 216 and 218 made through the exposure and development. Generally, in order to raise the integration degree of an SRAM section, a distance between the end of the resist pattern 212 and the end of the resist pattern 216 is set to a minimum patterning width of the exposure and development processes.

As the resist patterns 212 and 216 are narrowed, the distance between the ends becomes longer. In the example shown in FIG. 7B, as the end of the gate electrode 213 retracts and this retraction amount becomes large, the end of the gate electrode 213 enters the active region 210 in some cases. If the active regions 210 and 211 are disposed more spaced apart from each other by considering the retraction of the ends of gate electrodes, a chip area becomes large.

SUMMARY OF THE INVENTION

It is an object of the present invention to provide a semiconductor device capable of speeding up FET's on a logic circuit section and highly integrating an SRAM section, and its manufacture method.

According to one aspect of the present invention, there is provided a method of manufacturing a semiconductor device comprising the steps of: forming a gate electrode conductive film on a surface of a semiconductor substrate on which first and second sections are defined, field effect transistors having channel lengths different from each other being respectively formed on the first and second sections; forming first and second gate mask patterns made of a first insulating material on the gate electrode conductive film on the first and second sections; forming sidewall spacers on sidewalls of the first and second gate mask patterns, the sidewall spacer being made of a second insulating material having an etching resistance different from the first insulating material; covering the second section with a mask pattern; removing the sidewall spacer on the sidewall of the first gate mask pattern by using the mask pattern as a mask; removing the mask pattern; and etching the gate electrode conductive film to leave first and second gate electrodes on the first and second sections, by using as a mask the first and second gate mask patterns and the sidewall spacer left on the sidewall of the second gate mask pattern.

According to another aspect of the present invention, there is provided a semiconductor device comprising: a first field effect transistor having a gate electrode formed on a first section of a semiconductor substrate; a second field effect transistor having a gate electrode formed on a second section of said semiconductor substrate; and a ridge structure made of insulating material formed on an upper surface of the gate electrode of said second field effect transistor, said ridge structure extending along side edges of the gate electrode.

When the gate electrode is patterned, the ridge structure is used as an etching mask, so that the gate electrode can be broadened by a width of the ridge structure and can also be elongated. It is therefore possible to make the gate length of the field effect transistor on the second section different from the gate length of the field effect transistor on the first section.

According to another aspect of the present invention, there is provided a method of manufacturing a semiconductor device comprising the steps of: forming a gate electrode conductive film on a surface of a semiconductor substrate on which first and second sections are defined, field effect transistors having channel lengths different from each other being formed on the first and second sections; covering an upper surface of the gate electrode conductive film on the second section with a first mask film made of a first material; forming a second mask film on the gate electrode conductive film on the first section and on the first mask, the second mask being made of second material having an etching resistance different from the first material; forming resist patterns corresponding to gate electrodes on the second mask film on the first and second sections; etching the second and first mask films to leave a first gate mask pattern of the second mask film on the first section and a second gate mask pattern having a lamination structure of the first and second mask films on the second section, by using the resist patterns as a mask; side-etching a portion of the second mask film constituting the first and second gate mask patterns; and etching the gate electrode conductive film to leave first and second gate electrodes on the first and second sections, by using the first and second gate mask patterns as a mask.

According to another aspect of the present invention, there is provided a semiconductor device comprising: a first field effect transistor having a gate electrode formed on a first section of a semiconductor substrate; a second field effect transistor having a gate electrode formed on a second section of said semiconductor substrate; a first film made of a first material and disposed on the gate electrode of said second field effect transistor, an outer periphery of said first film being aligned with side edges of the underlying gate electrode; a second film disposed on said first film, an outer periphery of said second film positioning inside the outer periphery of said first film, and said second film being made of a second material having an etching resistance different from the first material; and a third film disposed on the gate electrode of said first field effect transistor, an outer periphery of said third film being aligned with side edges of the underlying gate electrode, said third film being made of the second material.

When the gate electrodes are patterned, the third film is used as an etching mask on the first section, and the first film is used as an etching mask on the second section. It is therefore possible to make the gate length of the field effect transistor on the second section different from the gate length of the field effect transistor on the first section.

As described above, on one section of a substrate surface, the gate length of FET can be shortened more than the minimum patterning line width of photolithography, and on another section, the gate length of FET can be made approximately equal to the minimum patterning line width of photolithography. An operation speed of an integrated circuit on the section with the gate length being shortened can be raised. On the other section, even if the gate length is shortened, conventional design can be inherited.

DETAILED DESCRIPTION OF THE PREFERRED EMBODIMENTS

Figure 1A:
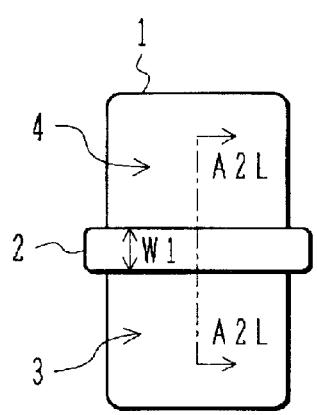
FIGS. 1A and 1B are plan views showing a semiconductor device according to a first embodiment.
Figure 1B:
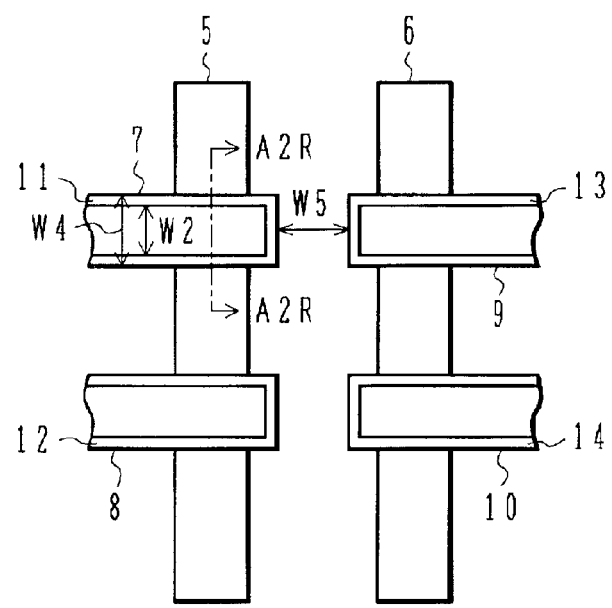
Figure 2:
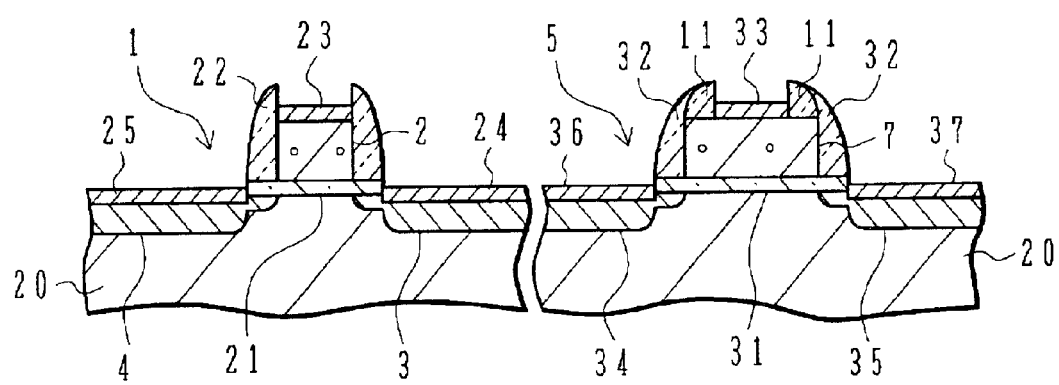
FIG. 2 is a cross sectional view of the semiconductor device of the first embodiment.

With reference to FIGS. 1A and 1B and FIG. 2, the structure of a semiconductor device according to a first embodiment of the invention will be described.

FIG. 1A is a plan view showing an FET on the logic circuit section of a semiconductor device of the first embodiment. A gate electrode 2 crosses an active region 1 and divides the active region into a source region 3 and a drain region 4.

FIG. 1B is a plan view showing an FET on the SRAM section of the semiconductor device of the first embodiment. Active regions 5 and 6 are disposed in parallel to each other. Gate electrodes 7 and 8 cross the active region 5, and gate electrode 9 and 10 cross the active region 6. The gate electrode 9 is disposed on a straight line extending from the gate electrode 7, and one end of the gate electrode 7 faces one end of the gate electrode 9. The relative positional relation between the gate electrodes 8 and 10 is the same as that between the gate electrodes 7 and 9. Ridge structures 11 to 14 are disposed respectively on the upper surfaces of the gate electrodes 7 to 10 along the side edges of the gate electrodes.

In each of the ridge structures 11 to 14, a distance W2 between two regions (extending in the horizontal direction in FIG. 1B) crossing the gate length direction (the vertical direction in FIG. 1B) is equal to the gate length W1 of FET shown in FIG. 1A.

The left and right portions of FIG. 2 correspond respectively to a cross sectional view taken along one-dot chain line A2L—A2L shown in FIG. 1A and a cross sectional view taken along one-dot chain line A2R—A2R shown in FIG. 1B.

As shown in FIG. 2, on a partial surface of the active region 1 of a silicon substrate 20, the gate electrode 2 of polysilicon is formed so that a gate insulating film 21 is sandwiched between the silicon substrate 20 and the gate electrode 2. The upper surface of the gate electrode 2 is covered with a cobalt silicide film 23. On a sidewall of the gate electrode 2, a sidewall spacer 22 of silicon oxide is formed. The top of the sidewall spacer 22 protrudes higher than the upper surface of the cobalt suicide film 23.

On both sides of the gate electrode 2, the source region 3 and drain region 4 of a lightly doped drain structure (LDD structure) are formed. The upper surfaces of the source region 3 and drain region 4 are covered with cobalt suicide films 24 and 25.

On a partial surface of the active region 5, the gate electrode 7 of polysilicon is formed with a gate insulating film 31 being interposed therebetween. On the upper surface of the gate electrode 7, the ridge structure 11 is disposed extending along the side edges of the gate electrode 7. The ridge structure 11 is made of silicon oxide.

The upper surface of the gate electrode 7 surrounded by the ridge structure 11 is covered with a cobalt silicide film 33. On a sidewall of the gate electrode 7 and on the outer peripheral surface of the ridge structure 11, a sidewall spacer 32 of silicon oxide is formed. On both sides of the gate electrode 7, the source region 34 and drain region 35 of the LDD structure are formed. The upper surfaces of the source region 34 and drain region 35 are covered with cobalt silicide films 36 and 37.

Next, with reference to FIGS. 3A to 3F, a method of manufacturing the semiconductor device of the first embodiment will be described. The left portion of each of FIGS. 3A to 3F corresponds to a cross sectional view taken along one-dot chain line A2L—A2L shown in FIG. 1A and the right portion corresponds to a cross sectional view taken along one-dot chain line A2R—A2R shown in FIG. 1B.

Figure 3A:
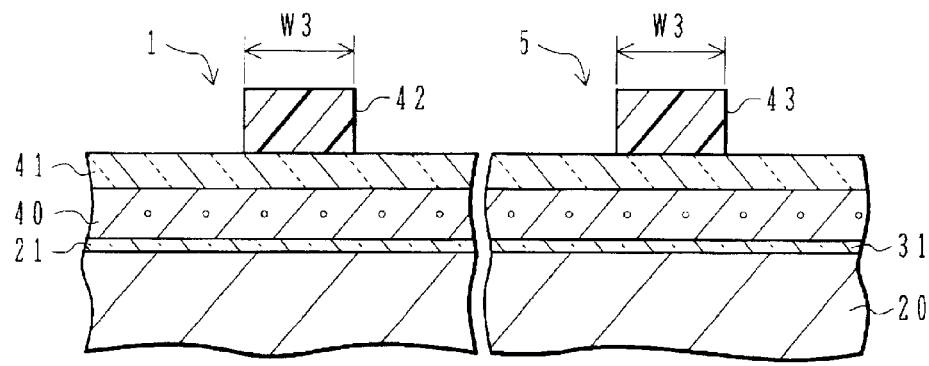
FIGS. 3A to 3F are cross sectional views illustrating a method of manufacturing the semiconductor device of the first embodiment.

As shown in FIG. 3A, in a surface layer of the silicon substrate 20, p-type and n-type wells are formed as desired, and an element separation region is formed by local oxidation of silicon (LOCOS) or by shallow trench isolation (STI). The element separation region defines the active regions 1 and 5.

On the surface of the silicon substrate 20, the gate insulating films 21 and 31 of 4 nm thick are formed by thermal oxidation. A conductive film 40 for a gate electrode made of polysilicon and having a thickness of 180 nm is formed on the gate insulating films 21 and 31. For example, the conductive film 40 for the gate electrode is formed by chemical vapor deposition (CVD).

On the gate electrode conductive film 40, a silicon nitride film 41 of 50 nm thick is formed by thermal CVD. A nitride film of 100 nm thick may be formed by plasma-enhanced CVD. The thickness of the silicon nitride film to be formed by plasma-enhanced CVD is set different from the thickness of the silicon nitride film to be formed by thermal CVD, because the refractive index of silicon nitride becomes different depending upon a film forming method. A silicon oxynitride film of 30 nm thick may be formed on the upper or lower surface of the silicon nitride film, serving as an antireflection film.

Resist patterns 42 and 43 corresponding to the gate electrodes are formed on the silicon nitride film 41 in areas above the active regions 1 and 5. The resist patterns 42 and 43 are formed through exposure using KrF excimer laser at a wavelength of 248 nm and development. A width W3 along the gate length direction of the resist patterns 42 and 43 is the minimum patterning line width of the photolithography process.

The resist pattern 43 corresponds to the gate electrode 7 shown in FIG. 1B. At the same time when the resist pattern 43 is formed, resist patterns corresponding to the gate electrodes 8, 9 and 10 are also formed although they do not appear in FIG. 3A. A distance between one end of the resist pattern corresponding to the gate electrode 7 and one end of the resist pattern corresponding to the gate electrode 9 is equal to the minimum removing width of the photolithography process.

Figure 3B:
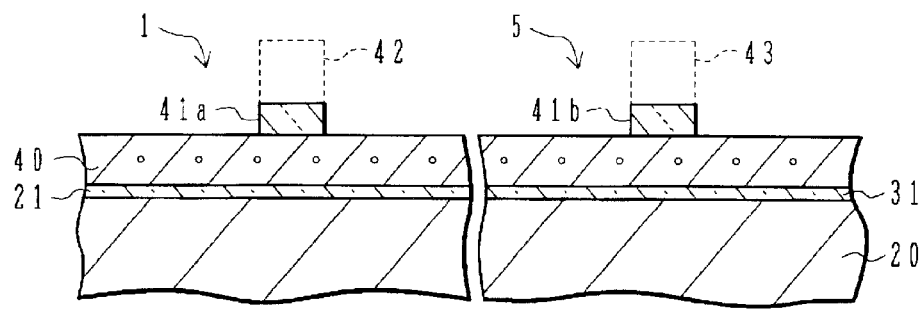

Processes up to the state shown in FIG. 3B will be described. The resist patterns 42 and 43 are partially etched to make them narrower by using mixed gas of nitrogen gas and oxygen gas. For example, the flow rate of nitrogen gas is 100 sccm, the flow rate of oxygen gas is 10 sccm, a pressure is 6.65 Pa (50 mTorr), and a high frequency power for generating plasma is 300 W. By using the narrowed resist patterns 42 and 43 as a mask, the silicon nitride film 41 is etched. A gate mask pattern 41a is left above the active region 1, and a gate mask pattern 41b is left above the active region 5. Etching the nitride film 41 is performed by reactive ion etching using mixed gas of $CF_4$, $CHF_3$ and Ar. After the silicon nitride film 41 is etched, the resist patterns 42 and 43 are removed. Since the resist patterns 42 and 43 are narrowed more than that just after the development, the line width of the left gate mask patterns 41a and 41b is narrower then the line width W3 of the resist patterns 42 and 43 just after the development.

An average line width W3 of the resist patterns 42 and 43 just after the development was 186.8 nm and 3σ of the line width was 21.8 nm. An average line width of the gate mask patterns 41a and 41b was 142.2 nm and 3σ of the line width was 16.7 nm.

Figure 3C:
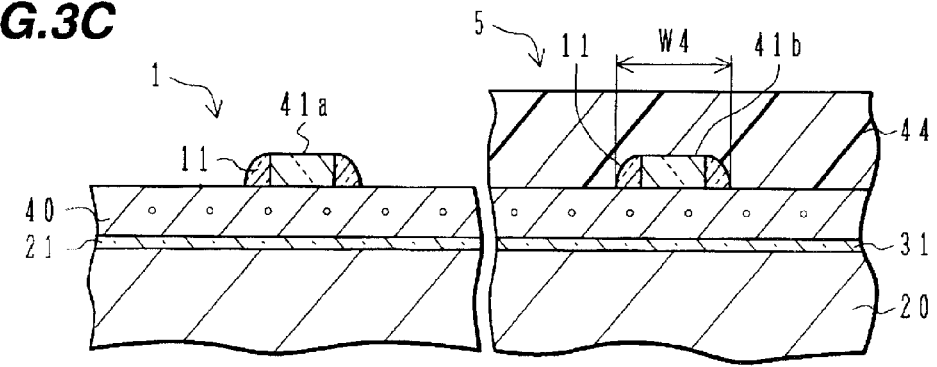

Processes up to the state shown in FIG. 3C will be described. A silicon oxide film is formed on the silicon nitride film 40, covering the gate mask patterns 41a and 41b. For example, this silicon oxide film is formed by thermal CVD. This silicon oxide film is anisotropically etched to leave the sidewall spacers 11 on the sidewalls of the gate mask patterns 41a and 41b. Anisotropically etching the silicon oxide film is performed by RIE using mixed gas of $CF_4$, $CHF_3$ and Ar. The flow rates of $CF_4$, $CHF_3$ and Ar are 40 sccm, 50 sccm and 800 sccm, respectively, the pressure is 213 Pa (1.6 Torr), and a high frequency power for generating plasma is 500 W.

A thickness of the silicon oxide film and an anisotropic etching time are set so that a total line width W4 of the gate mask pattern 41b and the sidewall spacer 11 formed on the sidewall of the gate mask pattern becomes approximately equal to the line width W3 of the resist pattern 43 shown in FIG. 3A.

The surface of the substrate above the active region 5 is covered with a resist pattern 44. The surface of the substrate above the active region 1 is exposed.

Figure 3D:
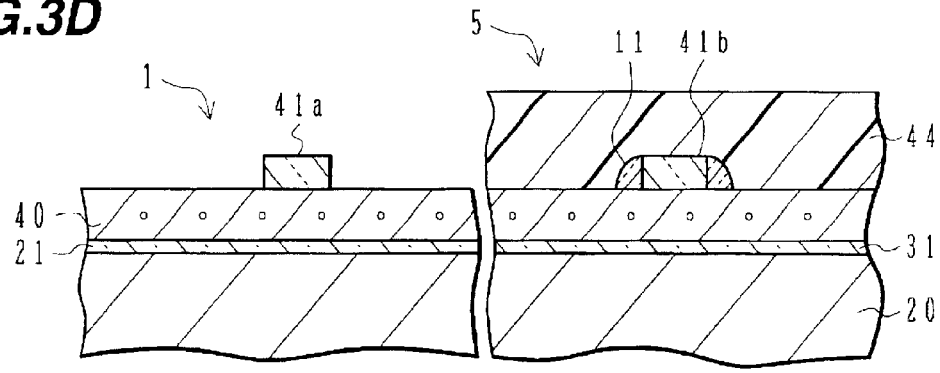

As shown in FIG. 3D, the sidewall spacer 11 above the active region 1 is removed, for example, by isotropic wet etching using hydrofluoric acid. Thereafter, the resist pattern 44 is removed.

Figure 3E:
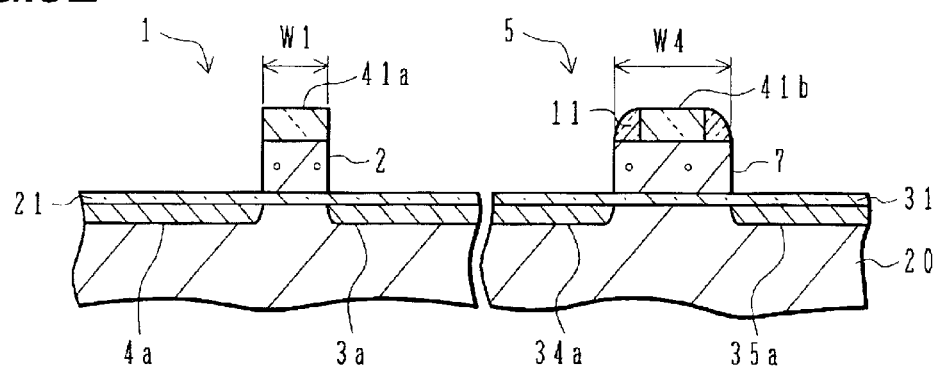

As shown in FIG. 3E, above the active region 1, by using the gate mask pattern 41a as a mask, and above of the active region 5, by using the gate mask pattern 41b and sidewall spacer 11 on the sidewall as a mask, the conductive film 40 for the gate electrode is etched. This etching is performed by RIE using HBr and $O_2$. The flow rates of HBr and $O_2$ are 100 sccm and 2 sccm, respectively, the pressure is 665 mPa (5 mTorr) and the high frequency power for generating plasma is 30 W.

Above the active region 1 the gate electrode 2 is left, and above the active region 5 the gate electrode 7 is left. The line width (gate length) W1 of the gate electrode 2 is smaller than the minimum patterning line width W3 shown in FIG. 3A. A line width (gate length) W4 of the gate electrode 7 is approximately equal to the minimum patterning line width W3 shown in FIG. 3A. A distance W5 shown in FIG. 1B is approximately equal to the distance between the resist patterns just after the development.

By using the gate electrodes 2 and 7 as a mask, impurity ions are implanted to form low concentration regions of the source and drain. The low concentration regions 3a, 4a, 34a and 35a are therefore formed.

Figure 3F:
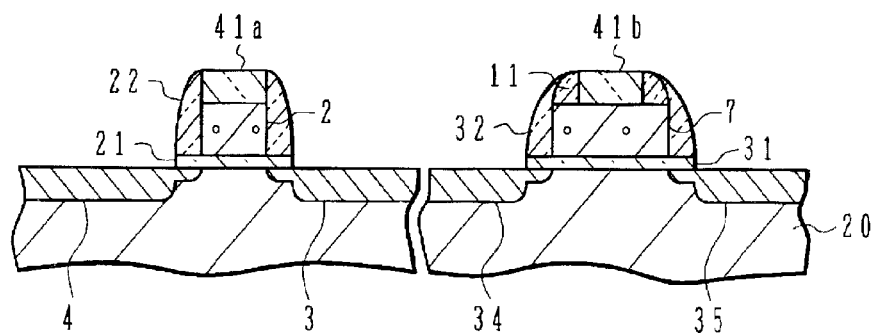

As shown in FIG. 3F, the sidewall spacer 22 of silicon oxide is formed on the sidewall of the lamination structure of the gate electrode 2 and gate mask pattern 41a. Similarly, the sidewall spacer 32 of silicon oxide is formed on the sidewall of the gate electrode 7 and on the outer peripheral surface of the sidewall spacer 11. The sidewall spacers 22 and 32 are formed by depositing a silicon oxide film on the whole substrate surface and anisotropically etching this silicon oxide film. Impurity ions are implanted to form the source and drain regions 3 and 4 and the source and drain regions 34 and 35.

After the ion implantation, the gate mask patterns 41a and 41b are removed by hot phosphoric acid. As shown in FIG. 2, the cobalt silicide films 24, 36, 25, 37, 23 and 33 are respectively formed on the exposed surfaces of the source regions 3 and 34, drain regions 4 and 35, and gate electrodes 2 and 7.

A method of forming the cobalt silicide film will be described briefly. First, a cobalt film of 10 nm thick and a TiN film of 30 nm thick are sequentially stacked on the substrate whole surface. Heat treatment is performed to realize a silicidation reaction at the interface between the cobalt film and silicon. Thereafter, the TiN film and an unreacted cobalt film are removed.

In the first embodiment described above, it is possible to set the gate length W1 of FET on the logic circuit section shown in FIG. 1A shorter than the minimum patterning line width W3 shown in FIG. 3A. The operation of the logic circuit can therefore be speeded up.

The gate length W4 of FET on the SRAM section shown in FIG. 1B is approximately equal to the minimum patterning line width W3. The distance W5 between one end of the gate electrode 7 and one end of the gate electrode 9 is approximately equal to the minimum removing width of the photolithography process for forming the resist patterns 42 and 43 shown in FIG. 3A. Namely, the size of each constituent element on the SRAM section is approximately equal to the size to be obtained if the gate mask patterns 41a and 41b were not narrowed in the etching process shown in FIG. 3B. It is therefore possible to shorten the gate length of only FET's on the logic circuit section and speed up the operation of the logic circuit, without revising the reticle for semiconductor devices of the generation that the gate length of FET on the logic circuit section is equal to the gate length of FET on the SRAM section. The size of each element on the SRAM section will not change even if the gate length of FET on the logic circuit section is shortened, so that a design change for the SRAM section is not necessary.

Furthermore, as shown in FIG. 1B, the distance W5 between one end of the gate electrode 7 and one end of the gate electrode 9 can be shortened to the degree approximately same as the minimum removing width. It is therefore possible to avoid the problem that the end of the gate electrode on the SRAM section retracts to the inside of the active region.

Next, with reference to FIGS. 4A and 4B and FIG. 5, the structure of a semiconductor device according to a second embodiment of the invention will be described.

Figure 4A:
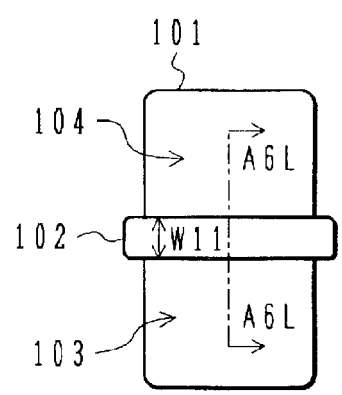
FIGS. 4A and 4B are plan views showing a semiconductor device according to a second embodiment.

FIG. 4A is a plan view showing an FET on the logic circuit section of a semiconductor device of the second embodiment. A gate electrode 102 crosses an active region 101, and divides the active region into a source region 103 and a drain region 104.

Figure 4B:
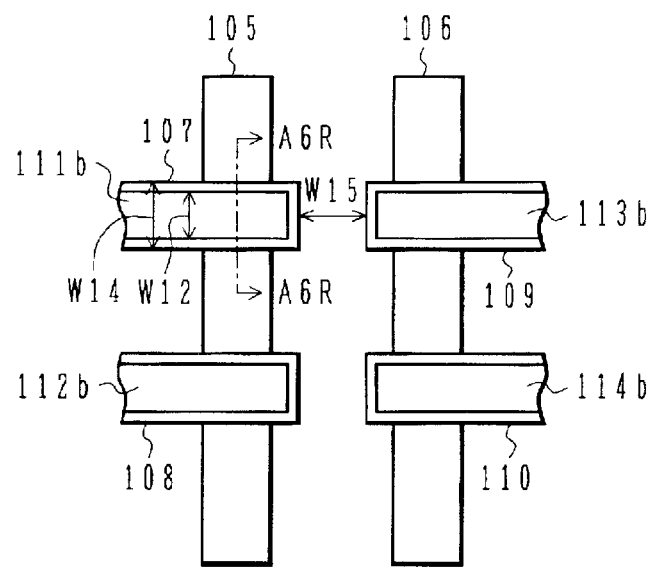

FIG. 4B is a plan view showing an FET on the SRAM section of the semiconductor device of the second embodiment. Active regions 105 and 106 are disposed in parallel to each other. Gate electrodes 107 and 108 cross the active region 105, and gate electrodes 109 and 110 cross the active region 106. The gate electrode 109 is disposed on a straight line extending from the gate electrode 107, and one end of the gate electrode 107 faces one end of the gate electrode 109 at a distance W15. The relative positional relation between the gate electrodes 108 and 110 is similar to that between the gate electrodes 107 and 109. Gate mask patterns 111b to 114b are respectively disposed on the upper surfaces of the gate electrodes 107 to 110 excepting the surfaces near the side edges.

In each of the gate mask patterns 111b to 114b, a width W12 along the gate length direction (the vertical direction in FIG. 4B) is equal to the gate length W11 of FET shown in FIG. 4A. A gate length W14 of FET on the SRAM section is longer than the gate length W11 of FET on the logic circuit section.

Figure 5:
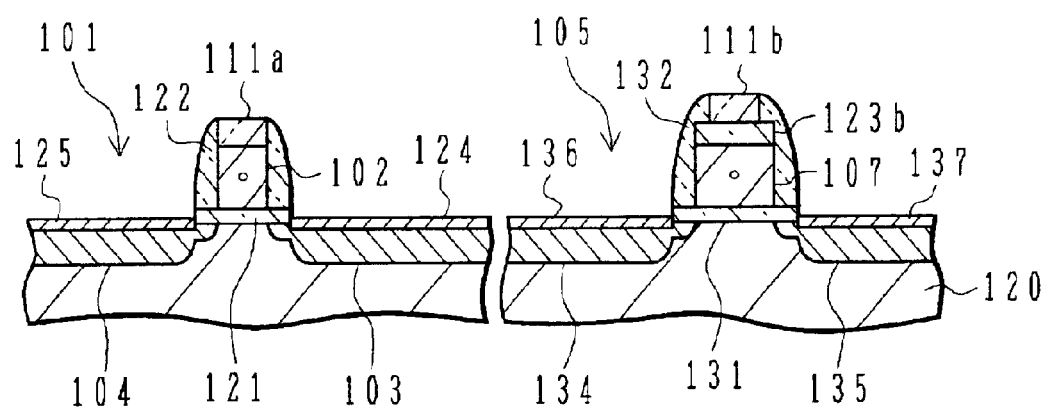
FIG. 5 is a cross sectional view of the semiconductor device of the second embodiment.

The left and right portions of FIG. 5 correspond respectively to a cross sectional view taken along one-dot chain line A6L—A6L shown in FIG. 4A and a cross sectional view taken along one-dot chain line A6R—A6R shown in FIG. 4B.

As shown in FIG. 5, on a partial surface of the active region 101 of a silicon substrate 120, the gate electrode 102 of polysilicon is formed with a gate insulating film 121 being interposed therebetween. The upper surface of the gate electrode 102 is covered with a gate mask pattern 111a of silicon oxide. On sidewalls of the gate electrode 102 and gate mask pattern 111a, a sidewall spacer 122 of silicon oxide is formed.

On both sides of the gate electrode 102, the source region 103 and drain region 104 of a lightly doped drain structure (LDD structure) are formed. The upper surfaces of the source region 103 and drain region 104 are covered with cobalt silicide films 124 and 125.

On a partial surface of the active region 105, the gate electrode 107 of polysilicon is formed with a gate insulating film 131 being interposed therebetween. The upper surface of the gate electrode 107 is covered with a gate mask pattern 123b of silicon nitride. The upper surface of the gate mask pattern 123b excepting the area near the side edges is covered with the second-layer gate mask pattern 111b of silicon oxide. A sidewall spacer 132 of silicon oxide is formed on sidewalls of the gate electrode 107 and gate mask patterns 123b and 111b.

On both sides of the gate electrode 107, the source region 134 and drain region 135 having the LDD structure are formed. The upper surfaces of the source region 134 and drain region 135 are covered with cobalt silicide films 136 and 137, respectively.

Next, with reference to FIGS. 6A to 6G, a method of manufacturing the semiconductor device of the second embodiment will be described. The left portion of each of FIGS. 6A to 6G corresponds to a cross sectional view taken along one-dot chain line A6L—A6L shown in FIG. 4A and the right portion corresponds to a cross sectional view taken along one-dot chain line A6R—A6R shown in FIG. 4B.

Figure 6A:
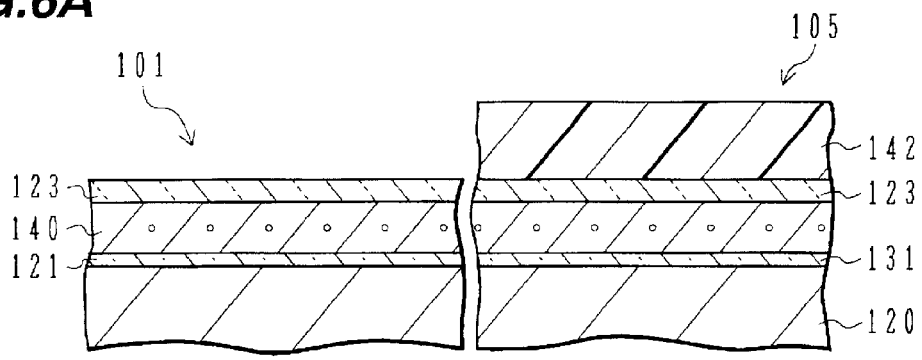
FIGS. 6A to 6G are cross sectional views illustrating a method of manufacturing the semiconductor device of the second embodiment.

As shown in FIG. 6A, in a surface layer of the silicon substrate 120, p-type and n-type wells are formed as desired, and an element separation region is formed by LOCOS or by STI. The element separation region defines the active regions 101 and 105.

The surface of the silicon substrate 120 is thermally oxidized to form the gate insulating films 121 and 131 of 4 nm thick. A gate electrode conductive film 140 made of polysilicon and having a thickness of 180 nm is formed on the gate insulating films 121 and 131 using CVD. In order to lower the resistance of the gate electrode, the gate electrode conductive film 140 may have a two-layer structure of a polysilicon layer and a tungsten silicide (WSi) layer.

On the gate electrode conductive film 140, a silicon nitride film 123 of 50 nm thick is formed by thermal CVD. Similar to the first embodiment, a silicon nitride film of 100 nm thick may be formed by plasma-enhanced CVD. A silicon oxynitride film of 30 nm thick may be formed on the upper or lower surface of the silicon nitride film, serving as an antireflection film.

The surface of the silicon nitride film 123 above the active region 105 is covered with a resist pattern 142. The surface of the silicon nitride film 123 above the active region 101 is exposed. By using the resist pattern 142 as a mask, the silicon nitride film 123 above the active region 101 is etched. Thereafter, the resist pattern 142 is removed.

Figure 6B:
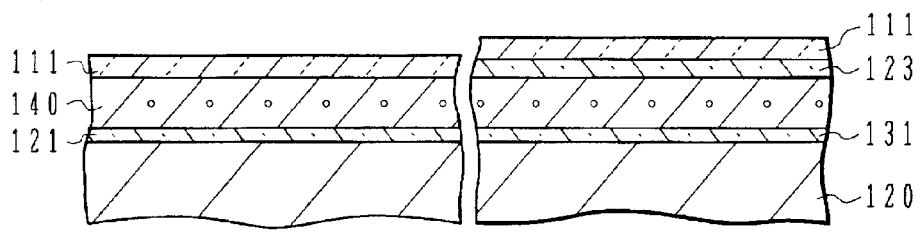

As shown in FIG. 6B, the silicon oxide film 111 of 70 nm thick is formed over the whole substrate surface.

Figure 6C:
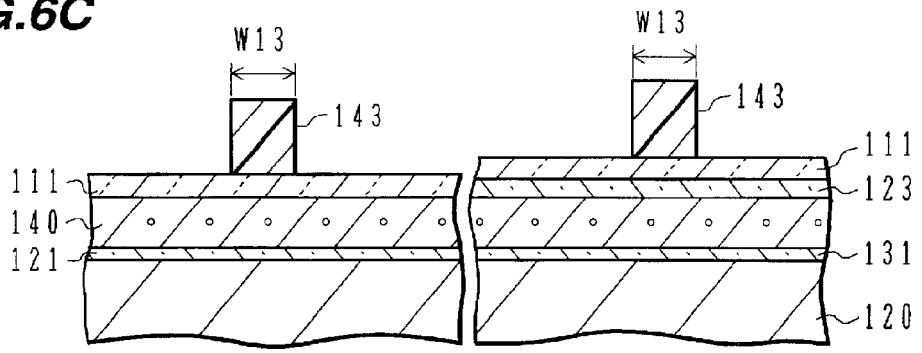

As shown in FIG. 6C, resist patterns 143 corresponding to the gate electrodes are formed on the silicon oxide film 111. A line width W3 of the resist pattern 143 is equal to the minimum patterning line width of the photolithography process. The resist pattern 143 shown in the right portion of FIG. 6C corresponds to the gate electrode 107 shown in FIG. 4B. Resist patterns corresponding to the gate electrodes 108 to 110 shown in FIG. 4B are also formed although they do not appear in FIG. 4B. The distance between one end of the resist pattern corresponding to the gate electrode 107 and one end of the resist pattern corresponding to the gate electrode 109 is equal to the minimum removing width of the photolithography process.

Figure 6D:
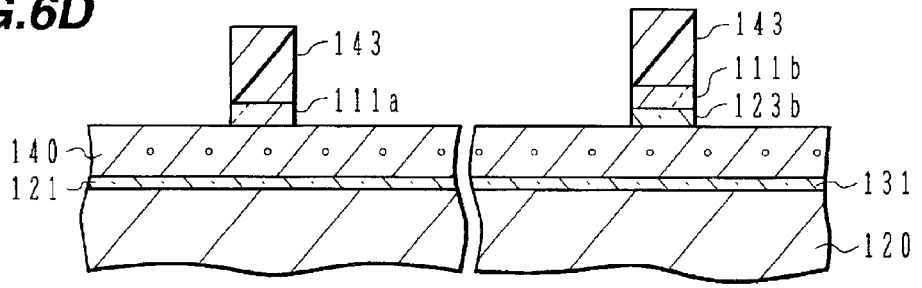

As shown in FIG. 6D, by using the resist pattern 143 as a mask, the silicon oxide film 111 and silicon nitride film 123 are etched. This etching may be performed by anisotropic RIE using mixed gas of $CF_4$, $CHF_3$ and Ar. After this anisotropic etching, only the silicon oxide film 111 is isotropically etched. For example, this isotropic etching may be performed by using a down flow etcher under the conditions of the flow rates of $CF_4$ and $O_2$ of 800 sccm and 130 sccm, respectively, the pressure of 133 Pa (1 Torr), and the input high frequency power of 1000 W. The gate mask patterns 111a and 111b of silicon oxide are therefore side-etched from the side faces thereof along the lateral direction.

Figure 6E:
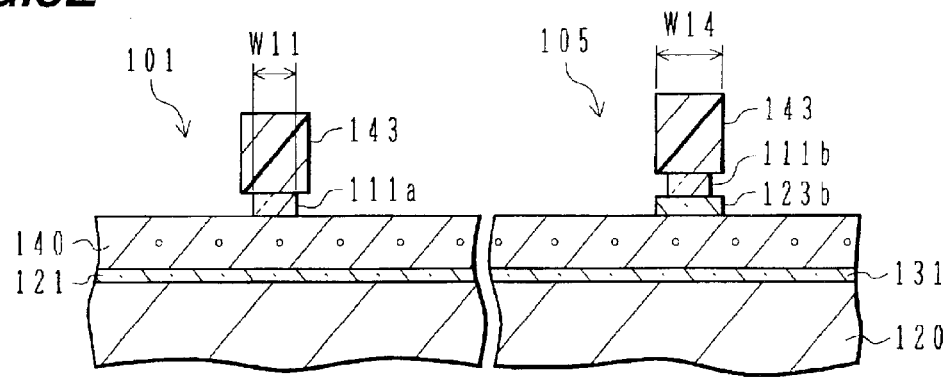

As shown in FIG. 6E, above the active region 101 the gate mask pattern 111a of silicon oxide is left, and above the active region 105 a lamination structure of the gate mask pattern 123b of silicon nitride and the gate mask pattern 111b of silicon oxide is left. The line width W11 of the gate mask pattern 111a is narrower than the minimum patterning line width W13 shown in FIG. 6C. The line width W14 of the gate mask pattern 123b is approximately equal to the minimum patterning line width W13 shown in FIG. 6C.

After the isotropic etching of silicon oxide is performed, the resist pattern 143 is removed.

Figure 6F:
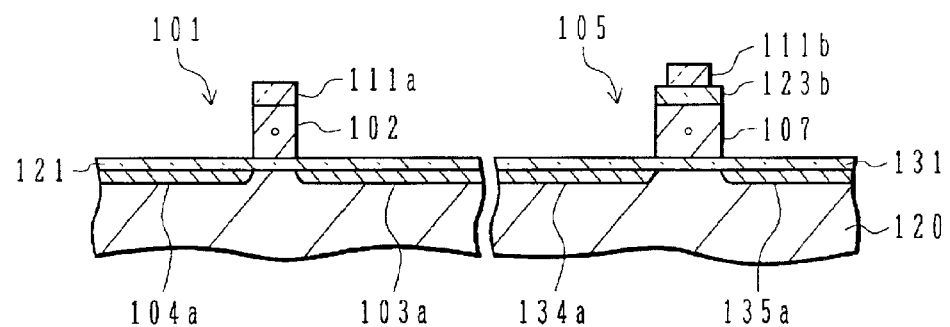

As shown in FIG. 6F, by using the gate mask pattern 111a as a mask above the active region 101, and by using the gate mask pattern 123b as a mask above the active region 105, the gate electrode conductive film 140 is etched. Above the active region 101, the gate electrode 102 is left which is narrower than the minimum patterning line width of the photolithography process. Above the active region 105, the gate electrode 107 is left which has a line width approximately equal to the minimum patterning line width of the photolithography process.

By using the gate electrodes 102 and 107 as a mask, impurity ions are implanted to form low concentration regions of the source and drain. The low concentration regions 103a, 104a, 134a and 135a are therefore formed.

Figure 6G:
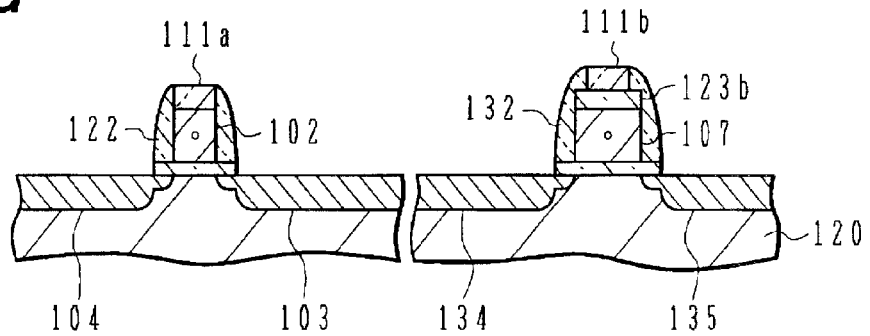
Figure 7A:
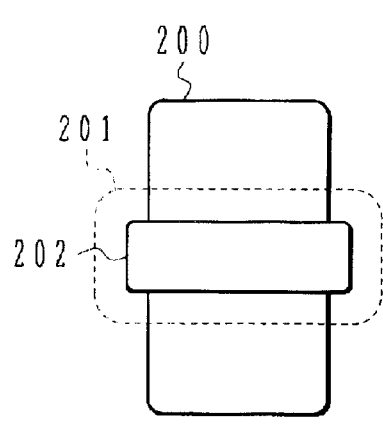
FIGS. 7A and 7B are plan views showing FET's of a semiconductor device having a logic circuit section and an SRAM section manufactured by a conventional method.
Figure 7B:
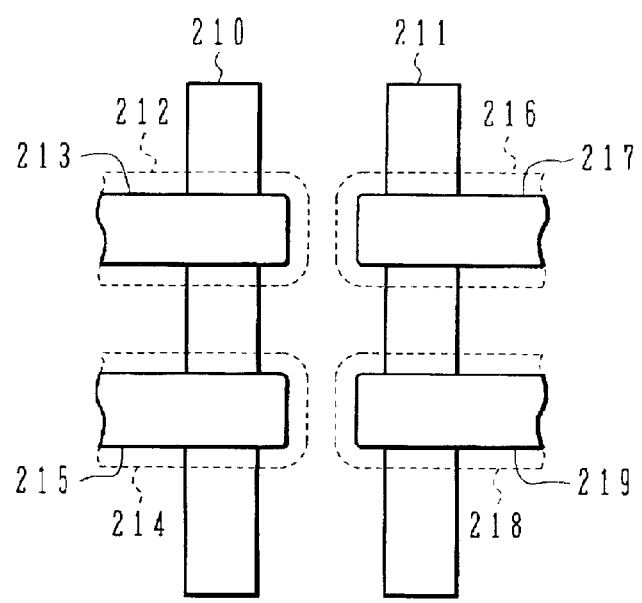

As shown in FIG. 6G, the sidewall spacer 122 of silicon oxide is formed on the sidewall of the lamination structure of the gate electrode 102 and gate mask pattern 111a. Similarly, the sidewall spacer 132 of silicon oxide is formed on the sidewalls of the gate electrode 107 and gate mask patterns 123b and 111b. Impurity ions are implanted to form the source and drain regions 103 and 104 and the source and drain regions 134 and 135.

After the ion implantation, as shown in FIG. 5, the cobalt silicide films 124, 136, 125, and 137 are formed on the exposed surfaces of the source regions 103 and 134 and drain regions 104 and 135.

Similar to the first embodiment, also in the semiconductor device of the second embodiment, it is possible to set the gate length W11 of FET on the logic circuit section shown in FIG. 4A shorter than the minimum patterning line width of the photolithography process. Further, the gate length W14 of FET on the SRAM section can be set approximately equal to the minimum patterning line width. Still further, the distance W15 between one end of the gate electrode 107 and one end of the gate electrode 109 is approximately equal to the minimum removing width of the photolithography process. Accordingly, the second embodiment has the advantageous effects similar to the first embodiment.

The present invention has been described in connection with the preferred embodiments. The invention is not limited only to the above embodiments. It is apparent that various modifications, improvements, combinations, and the like can be made by those skilled in the art.

I claim:

1. A semiconductor device comprising:
   a first field effect transistor having a first gate electrode formed on a first section of a semiconductor substrate;
   a second field effect transistor having a second gate electrode formed on the second section of said semiconductor substrate; and
   a ridge structure made of insulating material formed on an upper surface of the second gate electrode but not on an upper surface of the first gate electrode, said ridge structure being aligned and extending along a side edge of the second gate electrode without overlapping a center line of said second gate electrode.

2. A semiconductor device according to claim 1, wherein a distance between two portions of said ridge structure extending along a direction crossing a gate length direction is approximately equal to a gate length of said first field effect transistor.

3. A semiconductor device according to claim 1, further comprising a metal silicide film covering an upper surface of the first gate electrode of said second field effect transistor excepting the upper surface formed with said ridge structure.

4. A semiconductor device comprising:
   a first field effect transistor having a first gate electrode formed on a first section of a semiconductor substrate;
   a second field effect transistor having a second gate electrode formed on a second section of said semiconductor substrate;
   a first film made of a first material and disposed on the second gate electrode of said second field effect transistor, an outer periphery of said first film being aligned with side edges of the second gate electrode;
   a second film disposed on said first film, an outer periphery of said second film positioning inside the outer periphery of said first film, and said second film being made of a second material having an etching resistance different from the first material; and
   a third film disposed on the first gate electrode of said first field effect transistor, an outer periphery of said third film being aligned with side edges of the first gate electrode, said third film being made of the second material.

5. A semiconductor device according to claim 4, wherein a width of said second film along a gate length direction is approximately equal to a width of said third film along the gate length direction.

* * * * *